United States Patent [19]

Jackson et al.

[11] Patent Number: 4,815,202
[45] Date of Patent: Mar. 28, 1989

[54] ELECTRONIC COMPONENT INSERTION MACHINE

[75] Inventors: Rodney P. Jackson, Auburn; Stanley R. Vancelette, Salem, both of N.H.

[73] Assignee: Emhart Industries, Inc., Farmington, Conn.

[21] Appl. No.: 182,862

[22] Filed: May 2, 1988

[51] Int. Cl.⁴ ............................................. B23P 19/04
[52] U.S. Cl. ........................................ 29/741; 29/739; 29/740; 294/106; 294/116
[58] Field of Search .................... 29/741, 739, 740; 294/106, 116

[56] References Cited

U.S. PATENT DOCUMENTS

| | | | |
|---|---|---|---|
| 4,063,347 | 12/1977 | Woodman | 29/741 |
| 4,270,267 | 6/1981 | Bakermans | 29/731 |
| 4,293,998 | 10/1981 | Kawa et al. | 29/741 |
| 4,583,288 | 4/1986 | Young | 29/741 |
| 4,759,124 | 7/1988 | Snyder et al. | 29/740 |

Primary Examiner—P. W. Echols
Assistant Examiner—Kevin Jordan
Attorney, Agent, or Firm—Spencer T. Smith

[57] ABSTRACT

An electronic component insertion machine includes an insertion head having a pair of finger assemblies which grip a component prior to insertion. Each finger assembly has an actuating lever secured to a pivot shaft and a finger holder releasably clamped to the pivot shaft. The actuating levers have surfaces which are maintained in engagement throughout their displacement so that rotation of one effects a conjoint rotation of the other and are displaced to advanced positions. The finger holders are then unclamped, oriented to their desired orientations relative to their actuating levers and then clamped in position.

3 Claims, 2 Drawing Sheets

ELECTRONIC COMPONENT INSERTION MACHINE

A dual in-line package (DIP) component insertion machine inserts DIP components into a circuit board. In state-of-the-art machines such as disclosed in U.S. Pat. Nos. 3,550,238 and 4,212,075, each component is presented to a gripper mechanism which has a pair of opposed jaws which grip the opposed rows of leads. The gripper mechanism lowers the gripped component to partially insert the leads through receiving holes in the circuit board whereupon the jaws are retracted to release the component. A pusher located above the component engages and fully seats the component. A state of the art gripping mechanism is disclosed in U.S. Pat. No. 4,736,517 and the use of gear segments to rotate locator arms in chip placement machines is shown in U.S. Pat. No. 4,527,324.

It is an object of the present invention to provide an improved gripper mechanism for such a DIP component insertion machine.

Other objects and advantages of the present invention will become apparent from the following portion of the specification and from the accompanying drawings, which illustrate, in accordance with the mandate of the patent statutes, a presently preferred embodiment of the invention.

Referring to the drawings.

Figure 1:
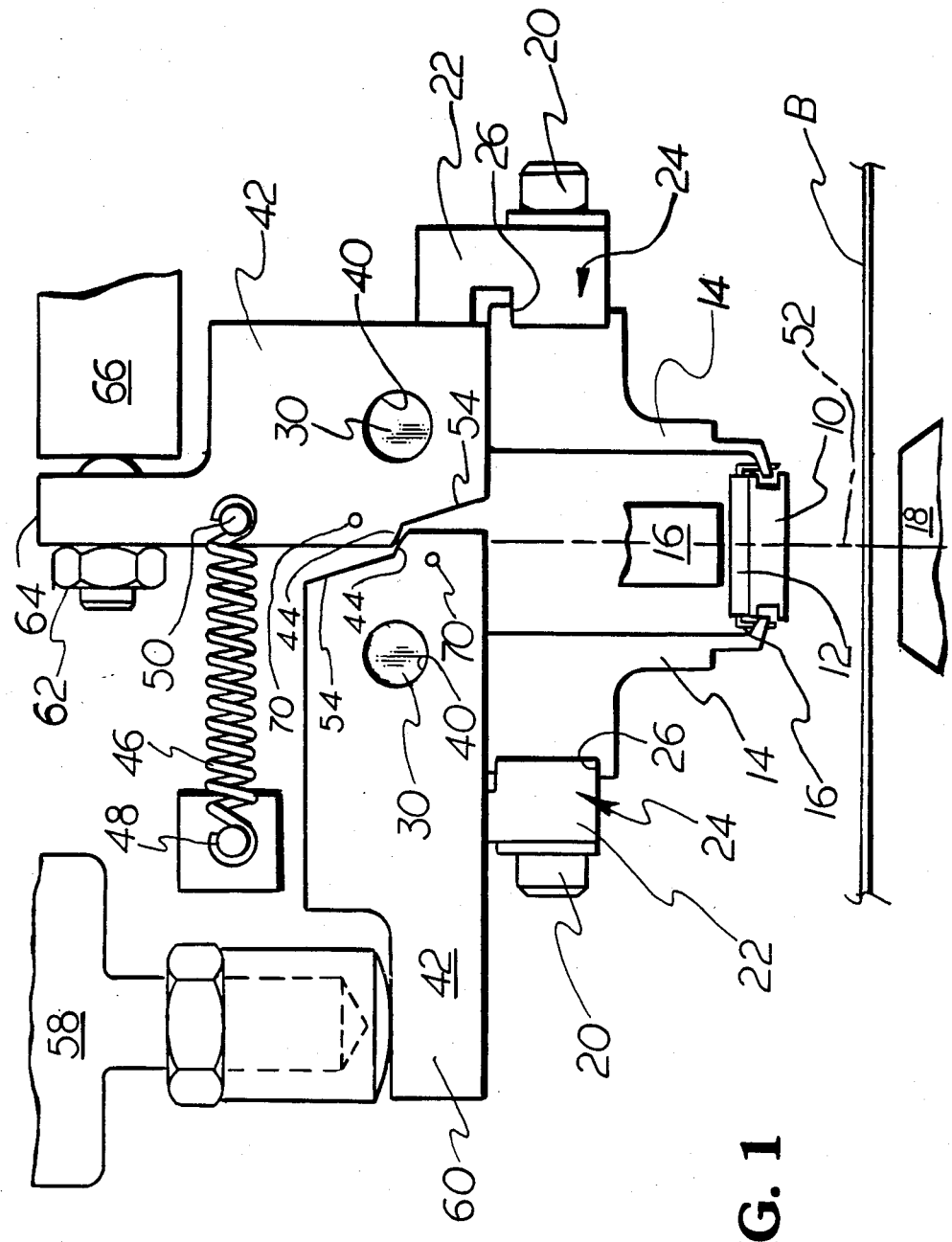
FIG. 1 is a front view of a gripper mechanism for an electronic component insertion machine made in accordance with the teachings of the present invention.

In a DIP component insertion machine, a mandrel 10 supports a DIP component 12 at a ready position where opposed fingers 14, displaced to the advanced position, illustrated in FIG. 1, grip the leads 16 of the DIP component. With the component gripped, the mandrel 10 is horizontally retracted and the fingers 14 are lowered partially inserting the component leads into a circuit board B. The opposed fingers are then retracted away from the component, releasing the component, and a pusher 16 is lowered to fully seat the component. The leads are then cut and clinched by a cut and clinch mechanism 18 to secure the component to the circuit board.

Figure 2:
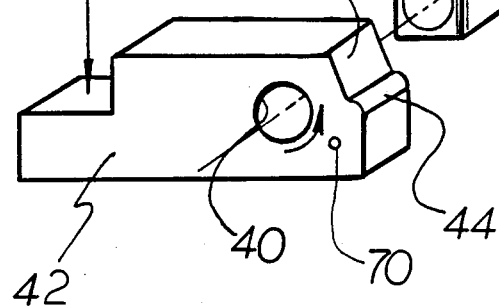
FIG. 2 is an oblique exploded view illustrating one of the jaw assemblies of the gripper mechanism shown in FIG. 1.

Each of the opposed fingers 14 of the insertion head illustrated in FIG. 1 is secured by suitable screws 20 to a finger carrier 22 and tongue 24 and groove 26 portions facilitate the changing of the fingers 14. A hole 28 (see FIG. 2) extends through each finger holder for receiving a pivot shaft 30. The finger holder is split 32 above the hole and screws 34 (presented as going from the front to the back of the finger holder instead of from back to front for purposes of illustration) will clamp the finger holder to the pivot shaft 30.

The pivot shaft 30 for each finger is rotatably supported within thru-holes 36 and 36A in a shaft support bracket 38 secured to the insertion head housing. One end of each pivot shaft 30 is located within a thrubore 40 in its finger actuating lever 42 and that lever 42 is secured (welded) to the shaft 30. Rotative displacement of a finger actuating lever accordingly results in conjoint rotational displacement of the associated finger 14.

The desired orientation of a finger 14 relative to its actuating lever 42 can be set by loosening the clamp screws 34, rotating the finger 14 relative to its lever 42 and then tightening the clamp screws 34 to clamp the finger holder 22 to the shaft 30. The pivot shaft has one diameter 33 passing through the lever and the shaft support bracket 38 portion adjacent the lever and has a smaller diameter 35 extending through the finger holder which corresponds to the finger holder hole 28 and the bracket portion 38 remote from the lever. The enlarged diameter 33 increases the rigidity of the pivot shaft.

Figure 3:
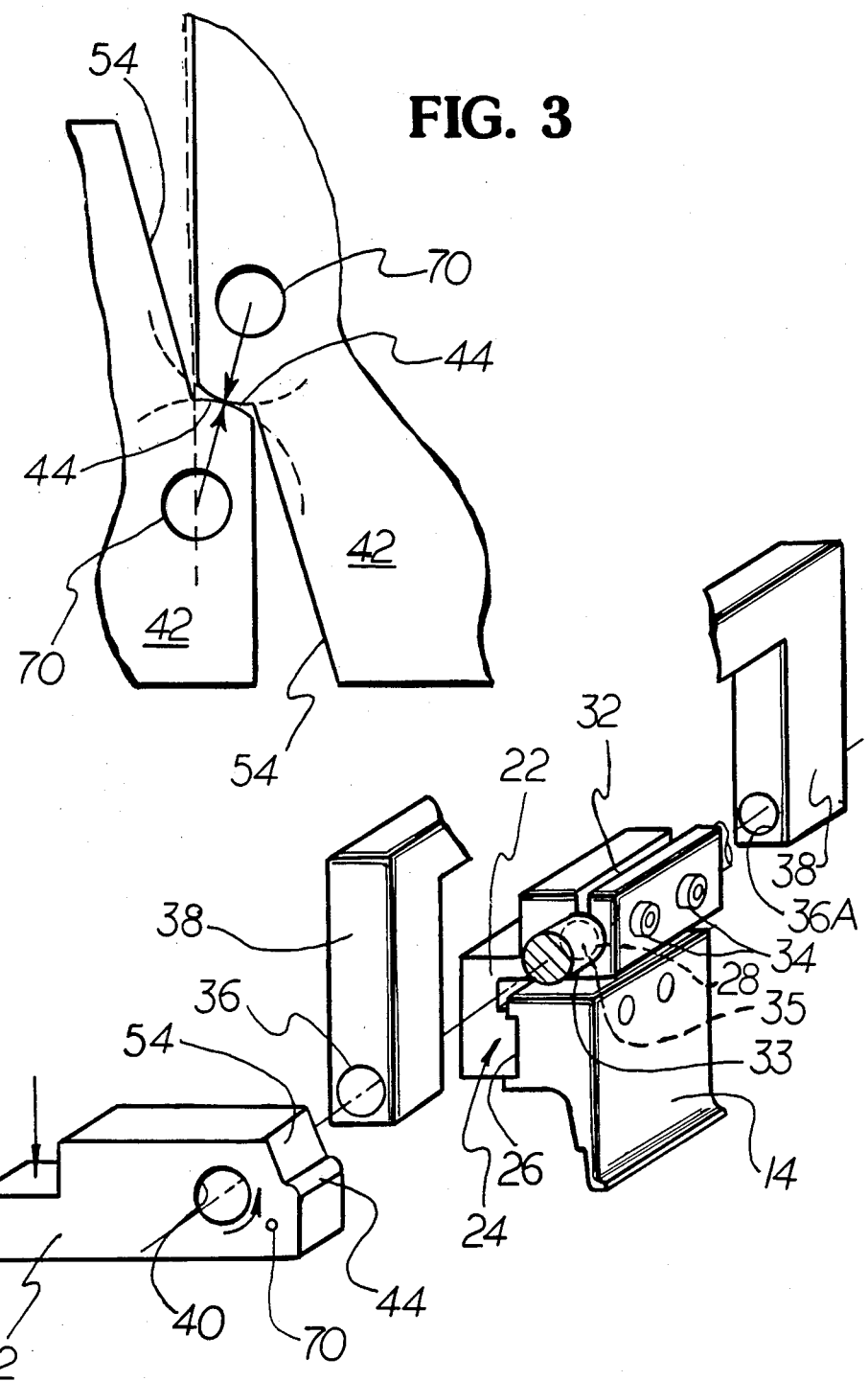
FIG. 3 is a greatly enlarged view of a portion of the finger actuating levers illustrated in FIG. 1.

As can be seen from from FIG. 3, the finger actuating levers have axially extending, radiused, engaging surfaces 44 which are maintained in continuous engagement by a spring 46 extending between an insertion head frame pin 48 and a pin 50 secured to the vertical finger actuating lever 42. These radiused surfaces 44 will maintain the fingers equally spaced from the mid-plane of the component 52 throughout their range of displacement. These radiused surfaces are involute curves or curves which very closely approximate true involute curves. Each lever has a cut away portion 54 to permit relative pivoting of the levers. To assure that the radiused surface will be parallel to the finger secured to the pivot shaft, the pivot shaft 30 is first welded to its lever and then the reduced shaft diameter portion 35 and the radiused surface 44 are machined. A tooling hole 70 is also provided at the centerpoint of each radius.

Displacement of the fingers is controlled by a pusher air cylinder 58 which engages the end portion 60 of the horizontal lever 42. Displacement of this cylinder 58 simultaneously pivots the fingers from their retracted positions to the illustrated advanced positions with the fingers continuously being precisely maintained equidistant from the mid-plane 52. A set screw 62 secured to the end portion 64 of the vertical lever 42 engages with a stop block 66 secured to the insert head housing to define the advanced position of the two operating levers 42. To set up the finger assemblies, the finger holders 22 are unclamped by loosening clamping screws 34. The pusher air cylinder 58 is operated to conjointly rotate the pivot levers until further rotation of the vertical lever 42 is stopped by stop block 66. With the actuating levers in their fully rotated positions, each of the finger holders is then rotated to locate the finger element at the illustrated desired gripping location and then clamped in position by tightening the screws 34.

We claim:

1. A machine for inserting DIP electronic components comprising:
   mandrel means for supporting a DIP component at a ready position;
   insertion head means for gripping the DIP component at the ready position and for inserting the gripped component into a circuit board;
   cut and clinch means for securing the inserted component to the printed circuit board;
   said insertion head means including first and second finger assemblies each having;
   a finger element,
   a finger holder,
   means for releasably securing said finger element to said finger holder,
   a pivot shaft,
   means for pivotally supporting said pivot shaft,
   means for releasably clamping said finger holder to said pivot shaft at a selected orientation, and an actuating lever secured to said pivot shaft whereby rotation of said actuating lever will rotate said finger element when said finger holder is clamped to said pivot shaft, each of said actuating levers having an axially extending curved surface approximating an involute curve;

means for maintaining said curved surfaces in engagement as said first actuating lever is displaced from a first position to a second position so that said second actuating lever will be conjointly displaced from a first position to a second position; and stop means for stopping the displacement of said second actuating lever at said second position thereby stopping the displacement of said first actuating lever at said second position, whereby the orientation of said first finger holder relative to the orientation of said first actuating lever can be selected by rotating said first finger holder around said first pivot shaft and maintained by operating said first finger holder clamping means, and whereby the orientation of said second finger holder relative to the orientation of said second actuating lever can be selected by rotating said second finger holder around said second pivot shaft and maintained by operating said second finger holder clamping means.

2. A machine for inserting DIP electronic components according to claim 1, wherein said maintaining means includes a spring.

3. A machine for inserting DIP electronic components according to claim 1 wherein each of said finger holders includes tongue means and each of said finger elements includes groove means to facilitate the changing of finger elements.

* * * * *